United States Patent
Bogumilowicz et al.

(10) Patent No.: US 10,354,870 B2
(45) Date of Patent: Jul. 16, 2019

(54) METHOD FOR DETERMINING PREFERENTIAL DEPOSITION PARAMETERS FOR A THIN LAYER OF III-V MATERIAL

(71) Applicant: COMMISSARIAT À L'ENERGIE ATOMIQUE ET AUX ENERGIES ALTERNATIVES, Paris (FR)

(72) Inventors: Yann Bogumilowicz, Grenoble (FR); Jean-Michel Hartmann, Montbonnot Saint-Martin (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 656 days.

(21) Appl. No.: 14/933,554

(22) Filed: Nov. 5, 2015

(65) Prior Publication Data

US 2016/0126095 A1 May 5, 2016

(30) Foreign Application Priority Data

Nov. 5, 2014 (FR) .................................... 14 60693

(51) Int. Cl.
*H01L 21/02* (2006.01)
*C30B 25/16* (2006.01)
(Continued)

(52) U.S. Cl.
CPC ........ *H01L 21/02636* (2013.01); *C30B 25/16* (2013.01); *C30B 25/183* (2013.01);
(Continued)

(58) Field of Classification Search
CPC combination set(s) only.
See application file for complete search history.

(56) References Cited

U.S. PATENT DOCUMENTS

| 4,826,784 A * | 5/1989 | Salerno | H01L 21/02381 117/95 |
| 6,537,370 B1 * | 3/2003 | Hernandez | C30B 25/02 117/88 |
| 6,983,233 B1 * | 1/2006 | Falcioni | C40B 50/02 702/19 |
| 2007/0231488 A1 * | 10/2007 | Von Kaenel | C23C 16/0209 427/255.15 |

FOREIGN PATENT DOCUMENTS

WO 2005/108654 A1 11/2005

OTHER PUBLICATIONS

Kawabe et al., "Molecular Beam Epitaxy of Controlled Single Doman GaAs on Si (100)," Japanese Journal of Applied Physics, Apr. 1986, vol. 25, No. 4, pp. L285-L287.

(Continued)

*Primary Examiner* — Erin F Bergner
(74) *Attorney, Agent, or Firm* — Oliff PLC

(57) ABSTRACT

First, second and third series of samples are successively made so as to determine the influence of the deposition parameters on the crystallographic quality of a layer of semiconductor material of III-V type. The parameters studied are successively the deposition pressure, the deposition temperature and the deposited thickness of a sub-layer of semiconductor material of III-V type so as to respectively determine a first deposition pressure, a first deposition temperature at the first deposition pressure, and a first deposited thickness at the first deposition temperature and at the first deposition pressure. The sub-layer of semiconductor material of III-V type is thickened by ways of a second layer of semiconductor material of III-V type deposited under different conditions.

17 Claims, 2 Drawing Sheets

(51) Int. Cl.
- *C30B 25/18* (2006.01)
- *C30B 29/06* (2006.01)
- *C30B 29/08* (2006.01)
- *C30B 29/40* (2006.01)
- *C30B 29/42* (2006.01)
- *C30B 29/68* (2006.01)

(52) U.S. Cl.
CPC .............. *C30B 29/06* (2013.01); *C30B 29/08* (2013.01); *C30B 29/40* (2013.01); *C30B 29/42* (2013.01); *C30B 29/68* (2013.01); *H01L 21/0245* (2013.01); *H01L 21/0262* (2013.01); *H01L 21/02381* (2013.01); *H01L 21/02433* (2013.01); *H01L 21/02461* (2013.01); *H01L 21/02463* (2013.01); *H01L 21/02505* (2013.01); *H01L 21/02543* (2013.01); *H01L 21/02546* (2013.01)

(56) References Cited

OTHER PUBLICATIONS

Sieg et al., "Anti-Phase Domain-Free Growth of GaAs on Offcut (001) Ge Wafers by Molecular Beam Epitaxy with Supressed Ge Outdiffusion," Journal of Electronic Materials, 1998, vol. 27, No. 7, pp. 900-907.

Chriqui et al., "Direct Grown of GaAs-Based Structures on Exactly (001)-Oriented Ge/Si Virtual Substrates: Reduction of the Structural Defect Density and Observation of Electroluminescence at Room Temperature Under CW Electrical Injection," Journal of Crystal Growth, 2004, vol. 265, pp. 53-59.

Xuliang et al., "Epitaxy of GaAs Thin Film with Low Defect Density and Smooth Surface on Si Substrate," Journal of Semiconductors, Jul. 2014, vol. 35, No. 7, pp. 073002-1 thru 073002-5.

Nguyen et al., "Selective Epitaxial Growth of III-V Semiconductor Heterostructures on Si Substrates for Logic Applications," ECS Transactions, 2010, vol. 33, No. 6, pp. 933-939.

Bolkhovityanov et al., "GaAs Epitaxy on Si Substrates: Modern Status of Research and Engineering," Physics-Uspekhi, 2008, vol. 51, No. 5, pp. 437-456.

Ludowise, "Metalorganic Chemical Vapor Deposition of III-V Semiconductors," J. Appl. Phys., Oct. 1985, vol. 38, No. 8, pp. R31-R55.

Mason et al., "Statistical Principles in Experimental Design," Statistical Design and Analysis of Experiments: With Applications to Engineering and Science, Second Edition, Chapter 4, pp. 109-139.

Wang et al., "Fabrication of High Quality Ge Virtual Substrates by Selective Epitaxial Growth in Shallow Trench Isolated Si (001) Tranches," Thin Solid Films, 2010, vol. 518, pp. 2538-2541.

\* cited by examiner

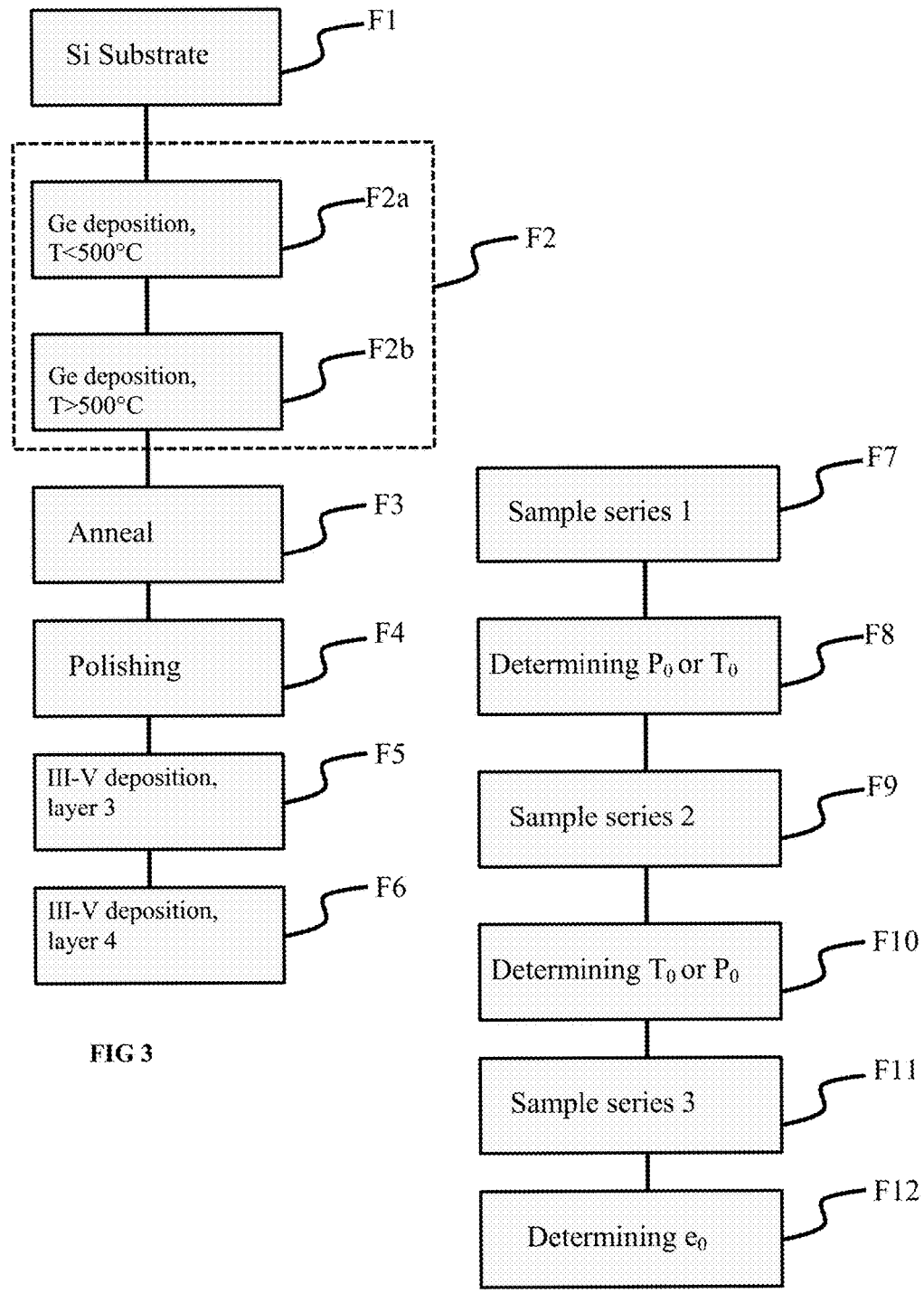

METHOD FOR DETERMINING PREFERENTIAL DEPOSITION PARAMETERS FOR A THIN LAYER OF III-V MATERIAL

BACKGROUND OF THE INVENTION

The invention relates to a method for determining deposition parameters of a layer made from semiconductor material of III-V type on a germanium layer.

STATE OF THE ART

For a large number of years, semiconductor materials of III-V type such as GaAs, InP and their associated alloys have enabled a considerable breakthrough to be made in optoelectronics. These materials have enabled devices with very good performances to be produced in the field of laser diodes and light-emitting diodes.

However, commonplace use of semiconductor materials of III-V type is limited by the difficulties of integration of these materials in modern microelectronic circuits which are for the most part fabricated on silicon substrates. The very large lattice parameter difference which exists between semiconductor materials of III-V type and silicon makes integration of an optoelectronic module on a silicon substrate extremely difficult to achieve.

Heteroepitaxy of GaAs layers on silicon substrates has been the subject of a great deal of research over the last few years. The publication by Kawabe et al. "Molecular Beam Epitaxy of Controlled Single Domain GaAs On Si (100)", Japanese Journal of Applied Physics, Part 2: Letters, 25(4), pp. 285-287 (1986) describes epitaxial growth of a GaAs layer directly on a silicon substrate. Growth is performed by the molecular beam epitaxy technique. This document teaches that the use of a silicon surface misaligned along the <110> axis enables the antiphase boundaries to be eliminated (misalignment of 4°+/−1°).

However, silicon substrates misaligned by few degrees are hardly compatible with the microelectronics industry. It is therefore very difficult to use this teaching for industrial fabrication of integrated circuits associated with optoelectronic modules formed from semiconductor material of III-V type.

The publication by Sieg et al. "Anti-Phase Domain-Free Growth of GaAs on Offcut (001) Ge wafers by Molecular Beam Epitaxy with Suppressed Ge Outdiffusion", Journal of Electronics Materials 27(7), pp. 900-907 (1998) describes epitaxial growth of a GaAs layer directly on a germanium substrate. The lattice parameter of germanium is quite close to the lattice parameter of the GaAs Crystal. This document teaches that the use of a germanium surface of (001) type misaligned in the <110> direction enables the anti-phase boundaries to be eliminated. Here again, it is important to observe that germanium substrates are difficult to use to form integrated circuits.

The publication by Chriqui "Direct Growth of GaAs-based structures on exactly (001)-oriented Ge/Si virtual substrates: reduction of the structural defect density and observation of electroluminescence at room temperature under CW electrical injection", Journal of Crystal Growth 265, pp 53-59 (2004) describes growth of a GaAs layer on a germanium layer itself formed on a silicon substrate. Growth is performed by epitaxy in vapor phase by means of organometallic precursors. Different samples were produced and studied. This document describes a sample in which a buffer layer of GaAs is covered by another layer of GaAs. Under a first condition, growth of the GaAs layer is performed at a temperature equal to 650° C. The presence of holes in the GaAs layers is observed. Growth at 450° C. is also performed and the layer formed no longer presents any holes.

The publication by Xuliang Zhou et al (Journal of Semiconductors, vol. 35, no. 7, page 073002 July 2014) deals with GaAs epitaxy with a low defect density and a smooth surface on a silicon substrate and proposes optimising the growth of GaAs thin films on misaligned Ge. Different deposition conditions are presented for deposition of the germanium buffer layer or for the deposited thickness of GaAs film. The substrate used is a substrate of (100) type misaligned by 5° with respect to the [110] direction.

The publication by Ngoc Duy Nguyen (ECS Transactions, vol. 33, no. 6, pages 933-939 January 2010) deals with GaAs epitaxy on a Ge layer. A layer of Ge with a thickness of 1 μm is deposited on a silicon layer. The Ge layer is polished by CMP before deposition of a GaAs layer. The substrate is a substrate of (100) type misaligned by 6° with respect to the <110> direction.

The document WO 2005/108654 describes a fabrication method of a virtual substrate for integration of III/V materials on silicon. The silicon substrate is successively capped by a layer of germanium and then by two layers of GaAs. The substrate is a substrate of (100) type misaligned by 6° with respect to the <110> direction.

OBJECT OF THE INVENTION

The object of the invention is to present a method for determining deposition conditions of a first layer of semiconductor material of III-V type on a germanium layer that is easy to implement and enables the conditions ensuring deposition of good crystallographic quality to be defined quickly.

This result tends to be achieved by means of a method for determining deposition parameters of a first layer of semiconductor material of III-V type in a sample successively comprising:
  a monocrystalline layer of relaxed germanium epitaxially grown from a first surface of crystalline orientation of (001) type of a monocrystalline silicon layer,
  a first monocrystalline layer made from semiconductor material of III-V type,
  a second monocrystalline layer made from semiconductor material of III-V type, the stack formed by the first and second layers of semiconductor material of III-V type having a thickness E,
  the method comprising:
  making a first series of samples in which the first layer of semiconductor material of III-V type having a first thickness is covered by the second layer of semiconductor material having a second thickness, the deposition conditions of the first layer of semiconductor material of III-V type being chosen such that the deposition pressure differs between the samples, the deposition temperature being identical between the samples and equal to a first deposition temperature,
  determining a first deposition pressure from the first series of samples and at least from a first parameter representative of the crystalline quality of the stack formed by the first and second layers of semiconductor material of III-V type,
  making a second series of samples in which the first layer of semiconductor material of III-V type having the first thickness is covered by the second layer of semiconductor material of III-V type having the second thickness, the deposition conditions of the first layer of semiconductor material of III-V type being chosen such that the deposition temperature differs between the samples, the deposition pressure being identical between the samples and equal to the first deposition pressure, determining a second deposition temperature from the second series of samples and by means of a second parameter representative of the crystalline quality of the stack formed by the first and second layers of semiconductor material of III-V type.

In an alternative embodiment, the order of the steps is changed so that the method comprises on the samples described in the foregoing:

making a first series of samples in which the first layer of semiconductor material of III-V type having a first thickness is covered by the second layer of semiconductor material having a second thickness, the deposition conditions of the first layer of semiconductor material of III-V type being chosen such that the deposition temperature differs between the samples, the deposition pressure being identical between the samples and equal to an initial deposition pressure, determining a first deposition temperature from the first series of samples and by means of at least a first parameter representative of the crystalline quality of the stack formed by the first and second layers of semiconductor material of III-V type, making a second series of samples in which the first layer of semiconductor material of III-V type having the first thickness is covered by the second layer of semiconductor material of III-V type having the second thickness, the deposition conditions of the first layer of semiconductor material of III-V type being chosen such that the deposition pressure differs between the samples, the deposition temperature being identical between the samples and equal to the first deposition temperature, determining a first deposition pressure from the second series of samples and by means of a second parameter representative of the crystalline quality of the stack formed by the first and second layers of semiconductor material of III-V type.

In an alternative embodiment, the method further comprises:

making a third series of samples in which the first layer of semiconductor material of III-V type is covered by this second layer of semiconductor material of III-V type, the thickness of the stack formed by the first and second layers being equal to the thickness E, the deposition conditions of the first layer of semiconductor material of III-V type being chosen such that the deposited thickness differs between the samples, the deposition pressure being identical between the samples and equal to the first deposition pressure, the deposition temperature being equal between the samples and equal to the second deposition temperature, determining a third deposition thickness of the first layer of semiconductor material of III-V type from the third series of samples by means of a third parameter representative of the crystalline quality of the stack formed by the first and second layers of semiconductor material of III-V type.

In a preferred embodiment, the second layer of semiconductor material of III-V type is deposited at a pressure equal to 20 Torr and at a temperature equal to 615° C.

It is also advantageous to provide for the first thickness of the first layer of semiconductor material of III-V type to be comprised between 10 nm and 80 nm and more particularly between 15 nm and 50 nm and even more particularly between 20 and 40 nm.

In a particular embodiment, it is advantageous to provide for the first deposition temperature to be comprised between 400° C. and 650° C., and preferentially between 495° C. and 615° C. and even more preferentially between 500° C. and 550° C. and in particularly advantageous manner between 515° C. and 540° C.

To form the germanium layer, it is advantageous to provide for the relaxed germanium monocrystalline layer to be epitaxially grown from a first surface of crystalline orientation of (001) type of a monocrystalline silicon layer. In a particularly advantageous configuration, the monocrystalline germanium layer is produced by means of a first deposition of a first germanium layer at a temperature of less than 500° C. followed by a second deposition of a second germanium layer at a temperature of more than 500° C.

It is also advantageous to provide a semiconductor material of III-V type chosen from GaAs, InP and the following ternary alloys: AlGaAs, InGaAs with an indium concentration less than or equal to 10%.

To easily choose an advantageous deposition pressure, it is advantageous to choose that the first parameter be a curve break in a curve representative of the defect density visible by optic microscopy according to the deposition pressure.

To easily choose an advantageous deposition temperature, it is advantageous to choose that the second parameter be an extremum in a curve representative of the defect density visible by optic microscopy according to the deposition temperature.

To easily choose an advantageous deposition thickness, it is advantageous to choose that the third parameter be an extremum in a curve representative of the defect density visible by optic microscopy according to the thickness of the first layer of semiconductor material of III-V type.

BRIEF DESCRIPTION OF THE DRAWINGS

Other advantages and features will become more clearly apparent from the following description of particular embodiments of the invention given for non-restrictive example purposes only and represented in the appended drawings, in which:

FIG. 3 represents a sequencing of steps for making a sample, in schematic manner, FIG. 4 represents a sequencing of steps for determining the improved deposition parameters, in schematic manner.

DETAILED DESCRIPTION

Figure 1:
FIGS. 1 and 2 represent a stack of layers used for fabrication of a sample, in schematic manner in cross-section.

As illustrated in FIG. 1, a silicon layer 1 is provided covered by a germanium layer 2. The silicon layer 1 presents a thickness advantageously comprised between 150 μm and 1000 μm. The silicon layer 1 can form a substrate or be deposited on the substrate. The diameter of the substrate is advantageously greater than or equal to 100 mm. The diameter of the substrate is for example equal to 100 mm, 200 mm or 300 mm so as to be used by conventional microelectronics industry equipment.

The silicon layer 1 has a first surface the crystalline orientation of which is preferably of (001) type so as to be compatible with conventional fabrication methods of microelectronic chips and more particularly of field effect transistors, for example of MOS type. The crystalline orientation is of (001) type, i.e. the first surface presents a misalignment of less than 1° with respect to the (001) plane. The method is particularly advantageous as it enables optimal operating conditions to be encountered for substrates of (001) type which are only slightly misaligned or not misaligned which is innovating with respect to the teachings of the prior art where the substrates are greatly misaligned (a misalignment typically more than 5°).

The silicon layer 1 has a first surface which is partially covered or at least partially covered by the germanium layer 2. As a variant, the silicon layer 1 can be eliminated, and the germanium layer acts as support. A germanium substrate can be used.

As illustrated in FIG. 3, the substrate can be produced by means of the following steps. A substrate comprising the silicon layer 1 is provided in a step F1. A germanium layer 2 is epitaxially grown on the silicon layer 1 in a step F2.

The germanium layer 2 is preferentially monocrystalline. The germanium layer 2 presents a thickness which is advantageously comprised between 0.1 µm and 10 µm. The germanium layer 2 is at least partially relaxed so that the lattice parameter at the surface of the layer 2 is equal or substantially equal to that of the germanium crystal. What is meant by germanium layer is one or more layers of germanium or of silicon-germanium alloy the atomic concentration of germanium of which is at least equal to 70%. The set of layers forming the germanium layer 2 presents a total thickness advantageously comprised in the range indicated in the foregoing. Advantageously, the top part of the germanium layer 2, i.e. the part designed to be in contact with the layer of semiconductor material 3 of III-V type, is made from pure germanium or from silicon-germanium alloy so that the top part of the germanium layer 2 presents the same lattice parameter as relaxed germanium.

The germanium layer 2 can be deposited by any suitable technique, for example by means of molecular beam epitaxy or by chemical vapor deposition.

Figure 2:

In an advantageous embodiment illustrated in FIG. 2, the germanium layer 2 is produced by means of two successive deposition steps of a germanium layer, preferably made from pure germanium. A first deposition step F2a is performed with a deposition temperature of less than 500° C. to form a first germanium layer 2a. A second germanium deposition step F2b is then performed at a temperature of more than 500° C. to form a second germanium layer 2b. A first germanium layer 2a is thus formed at a temperature of less than 500° C., advantageously between 350° C. and 450° C., and a second germanium layer 2b is formed on the first layer 2a. The second germanium layer 2b is formed at a temperature of more than 500° C., advantageously between 600° C. and 750° C. The use of a high temperature to form the second germanium layer enables the deposition time to be reduced when large thicknesses have to be deposited.

This breakdown into two consecutive deposition steps F2a and F2b makes it possible to have a surface of better quality for the future growth of the layer 3 of semiconductor material of III-V type.

In the case of deposition of the layer 1 on a silicon substrate, the use of a first deposition temperature which is relatively low enables the lattice parameter mismatch between the silicon and the layer 2a to be accommodated while ensuring formation of a smooth layer 2a. The use of higher temperatures for growth of the layer 2b then enables the surface roughness and defect density to be reduced.

In advantageous manner, the substrate remains in the same deposition chamber for growth of the layers 2a and 2b without being extracted into an outside environment.

In advantageous manner, thermal annealing is performed on the stack of the first layer 2a and second layer 2b of germanium in a step F3. This annealing enables the strains in the germanium layers to be reduced and facilitates relaxation of the germanium layer. Annealing is advantageously performed at a temperature comprised between 800° C. and 900° C., preferentially at 850° C. In advantageous manner, the heat treatment time at a temperature of more than 800° C. is about a few minutes, preferably between 1 and 10 minutes. In a particular embodiment, the annealing is performed by means of a plateau at a predefined temperature which advantageously represents the maximum annealing temperature. In an alternative embodiment, the annealing is performed by means of several different temperatures applied consecutively. In preferential manner, the annealing comprises an alternation between a high temperature and a low temperature so that the annealing alternates the temperature increase periods and the temperature decrease periods. In advantageous manner, the annealing comprises between 3 and 4 temperature cycles, a cycle comprising a temperature increase and a temperature decrease. In an advantageous embodiment, a cycle also comprises a temperature plateau for a time preferably comprised between 1 and 30 seconds. The high temperature is advantageously comprised between 800° C. and 900° C. and/or in the temperature range comprised between the growth temperature of the layer 2b +20° C., and the growth temperature of the layer 2b −20° C. In one embodiment, the low temperature can also can be comprised between 800° C. and 900° C.

In an alternative embodiment which can be combined with the previous embodiments, a chemical mechanical polishing step F4 is performed on the surface of the germanium layer 2 or 2b. In this way, it is possible to form a germanium layer 2/2b having a surface which presents similar properties to a germanium substrate. However, it was unexpectedly observed that very good results are able to be obtained without the use of the chemical mechanical polishing step.

For example purposes, the pure germanium layer 2 is achieved by means of a first deposition at a temperature of less than 500° C. and a second deposition at a temperature of more than 500° C. The stack is subjected to thermal annealing. With these operating conditions, it was possible to produce a pure germanium layer having a surface lattice parameter identical to that of the germanium crystal to within 0.5%. The measured lattice parameter is comprised between 5.63 Å and 5.69 Å. At the surface of the germanium layer, the roughness was measured as being less than 1 nm (rms roughness-rms standing for root mean square) on a 1×1 µm² field.

A layer of semiconductor material of III-V type is then deposited on the germanium layer 2 by metalorganic chemical vapor deposition (MOCVD). In a particularly advantageous manner, the layer of semiconductor material of III-V type is broken down into two elementary layers called first layer of semiconductor material 3 of III-V type and second layer of semiconductor material 4 of III-V type. Layers 3 and 4 are deposited in two distinct steps F5 and F6 with different deposition parameters, for example different deposition pressures and/or deposition temperatures.

The second layer of semiconductor material 4 of III-V type is separated from the germanium layer 2 by the first layer of semiconductor material 3 of III-V type as can be seen in FIGS. 1 and 2.

What is meant by semiconductor material of III-V type is a material such as GaAs, InP and the following ternary alloys: AlGaAs, InGaAs with an indium concentration less than or equal to 10%. In general manner, the semiconductor material of III-V type is a material which presents a lattice parameter in the 5.39 Å-5.63 Å range.

The deposited first layer of semiconductor material 3 of III-V type is assimilated to a nucleation layer. These deposition conditions are chosen such that the layer 3 of III-V material covers a maximum of the surface of the germanium layer 2.

Deposition of the first layer 3 is followed by deposition of the second layer 4 of semiconductor material of III-V type. The operating conditions are different and are chosen so as to achieve thickening of the first layer 3. For example, deposition of the second layer 4 is performed at a total pressure equal to 20 Torr. This deposition pressure enables a thickening of good quality to be had from the first layer 3. The pressure of 20 Torr ensures a good uniformity of deposition in addition to growth of a material of good crystallographic quality.

For example, a second layer 4 of GaAs can be deposited under the following conditions by organometallic chemical vapor deposition:
Pressure: 20 Torr (1 pascal=0.0075006 Torr)
Temperature: 615° C.
Organometallic precursors: Tributhylarsenic and Tributhylgallium.

In addition to breaking down deposition of the layer of semiconductor material of III-V type into two distinct deposition phases, it was discovered that particularly advantageous operating conditions exist for deposition of the first layer 3 of semiconductor material of III-V type. A quick and efficient manner for achieving these optimal or almost optimal deposition conditions was also discovered.

In a step F7, a first set of samples is produced. For each of the samples of the first set, two successive layers of semiconductor material of III-V type are deposited, layers 3 and 4. The first layer 3 of semiconductor material of III-V type is deposited with different deposition parameters so as to seek to ascertain the influence of the deposition pressure on the crystallographic quality of the stack of semiconductor material of III-V type formed by layers 3 and 4. The deposited thickness of the first layer 3 of semiconductor material of III-V type is constant between the samples of the first set. The deposition temperature is constant between the samples of the first set and equal to an initial deposition temperature.

The second layer of semiconductor material of III-V type is deposited under similar conditions for all the samples (thickness, temperature, pressure).

Once the first series of samples has been made, the latter are analysed so as to determine the influence of the deposition pressure on at least one of the parameters representative of the crystallographic quality of the deposition. In a step F8, this analysis enables a first deposition pressure $P_0$ to be determined which is the optimal deposition pressure or a pressure close to the optimal deposition pressure to obtain a deposition having a good crystallographic quality.

A first parameter is used so as to determine the pressure $P_0$. The first parameter is representative of the crystallographic quality of the assembly formed by layers 3 and 4. In the following examples, the parameter used is a defect density observed in top view by means of an optic microscope in Nomarski mode. In preferential manner, the first parameter is a slope break or a mimima in a curve representative of the density of optically visible defects versus the deposition pressure. The slope break can be a difference of at least 10% in the slopes of the segments, preferably at least 20% or at least 30%.

Sample 1

The first GaAs layer 3 was deposited at the pressure of 20 Torr and with a deposition temperature equal to 615° C. The organometallic precursors are Tributhylarsenic and Tributhylgallium. The thickness of the first GaAs layer 3 is equal to 80 nm and was thickened by means of the second GaAs layer 4 so that the thickness of the stack is equal to 270 nm.

Observation by optic microscope in Nomarski mode enabled a large density of holes to be observed making the surface of the sample very rough with an enlargement of ×50. On the observed samples, the hole density is greater than $10^8/cm^2$.

Sample 2

The first GaAs layer 3 was deposited at a pressure of 80 Torr and with a deposition temperature equal to 615° C. The organometallic precursors are Tributhylarsenic and Tributhylgallium. The thickness of the first GaAs layer 3 is equal to 80 nm and it was thickened by means of the second GaAs layer 4 so that the thickness of the stack is equal to 270 nm.

Observation by optic microscope in Nomarski mode (under the same conditions as previously) enabled a low hole density to be observed making the surface of the sample more easily usable than example 1. On the observed samples, the hole density is equal to $10^7/cm^2$.

Sample 3

The first GaAs layer 3 was deposited at a pressure of 450 Torr and with a deposition temperature equal to 615° C. The organometallic precursors are Tributhylarsenic and Tributhylgallium. The thickness of the first GaAs layer 3 is equal to 80 nm and it was thickened by means of the second GaAs layer 4 so that the thickness of the stack is equal to 270 nm.

Observation by optic microscope in Nomarski mode did not enable any holes to be observed. The surface appears to be very smooth. However, a large non-uniformity was observed in the deposited thickness of the first GaAs layer. On the observed samples, the hole density is equal to $10^7/cm^2$.

The non-uniformity of the thickness of the first GaAs layer 3 means that deposition at the pressure of 450 Torr is unusable in industrial manner. The thickness measurements made on the first GaAs layer 3 do in fact show that in the centre of the substrate the deposited thickness is less than 5 nm whereas at the periphery of the substrate the deposited thickness is substantially equal to 45 nm.

In the above sample, measurement of the hole density by observation with an optic microscope in Nomarski mode makes it possible to differentiate between depositions having a good crystallographic quality and depositions having an unacceptable crystallographic quality. However, it is also apparent in the foregoing example that the hole density criterion alone is not always sufficient and that it is advantageous to combine it with a criterion on the uniformity of deposition.

For example, the criterion on the non-uniformity NU can be calculated in the following manner:

$$NU = (Emax - Emin)/Emean$$

Emax represents the maximum measured thickness
Emin represents the minimum measured thickness
Emean represents the mean value of the measurements.

In advantageous manner, 49 uniformly distributed measurements are made on the substrate excluding the 5 mm of the outer edge of the substrate.

If the NU criterion has a value of less than 0.1, the deposition is considered as being uniform.

In a step F9, a second set of samples is made so as to investigate the influence of the deposition temperature on the crystallographic quality of the semiconductor material of III-V type.

For each of the samples of the second set, two successive layers of semiconductor material of III-V type are deposited. The first layer 3 of semiconductor material of III-V type is deposited with different parameters so as to seek to ascertain the influence of the deposition temperature on the crystallographic quality of the semiconductor material of III-V type. The deposited thickness of the first layer 3 of semiconductor material of III-V type is constant between the samples of the second set. The deposition pressure is constant between the samples of the second set and is equal to the first deposition pressure $P_0$ determined beforehand.

The second layer 4 of semiconductor material of III-V type is deposited under similar conditions for all the samples (thickness, temperature, pressure). The conditions are advantageously similar to those of the first series of samples.

Once the second series of samples has been made, the latter are analysed so as to determine the influence of the deposition temperature on at least one of the parameters representative of the crystallographic quality of the deposition. In a step F10, this analysis enables a first deposition temperature $T_0$ to be determined, which is the optimal deposition temperature or a temperature close to the optimal deposition temperature at the first deposition pressure $P_0$. The analysis is performed by means of a second parameter which can be identical to or different from the first parameter representative of the crystallographic quality used to quantify the influence of the deposition pressure.

It would appear detrimental to perform deposition of the layer of semiconductor material III-V and more particularly of GaAs at a temperature of more than 700° C., as in this temperature range, the organometallic precursors decompose in gaseous phase to form sub-species which are very difficult to incorporate in the semiconductor layers. It is therefore advantageous to limit the range of study to a maximum deposition temperature of less than 700° C. and preferentially less than 650° C. It seems advantageous to limit the range of study to a temperature less than or equal to 400° C. in order not to get dragged into too long methods which are therefore unsuitable for an industrial use.

For example, samples are formed with deposition temperatures comprised between 495° C. and 615° C. It is apparent that from 615° C., a reduction of the deposition temperature enables the quality of the GaAs layers to be improved by reducing the observable hole density. However, it was also observed that below 500° C., the defect density observed in the GaAs layers increases. For a first deposition pressure $P_0$, an optimal deposition temperature exists which is not necessarily the minimum temperature accessible by the deposition equipment. For several thickness conditions, it seems advantageous to limit the range of study to the 500-550° C. range or even to the 515-540° C. range, as the decision criterion is observed in these temperature ranges. It is advantageous to choose the initial deposition temperature in one of the above ranges.

The different samples were observed under the same conditions as before and the following defect densities were measured.

585° C., the defect density is equal to $1.10^7$ cm$^{-2}$
555° C., the defect density is equal to $1.10^7$ cm$^{-2}$
525° C., the defect density is equal to $1.10^6$ cm$^{-2}$
495° C., the defect density is equal to $2.10^6$ cm$^{-2}$ For example, the second parameter enabling the first deposition temperature to be determined is the defect density observed by optic microscopy in Nomarski mode and more particularly the minimum of the curve representing the defect density versus the temperature. This second discrimination parameter can be generalised to other materials than GaAs, for example to all semiconductor materials of III-V type.

Then, in a step F11, a third series of samples is made. For each of the samples of the third set, two successive layers of semiconductor material of III-V type are deposited. The first layer 3 of semiconductor material of III-V type is deposited at the first deposition temperature $T_0$ and at the first deposition pressure $P_0$. Only the deposited thickness varies between the samples so as to seek to ascertain the influence of the deposited thickness of the first layer 3 on the crystallographic quality of the final semiconductor material of III-V type. The deposited thickness of the stack formed by the first and second layers of semiconductor material of III-V type is constant between the samples of the third set.

The second layer 4 of semiconductor material of III-V type is deposited under similar conditions for all the samples (temperature and pressure) but with a variable thickness.

Once the third set of samples has been made, the latter are analysed so as to determine the influence of the thickness of the first layer 3 on at least one of the parameters representative of the crystallographic quality of the total deposition. This analysis enables a third deposition thickness to be determined for the first layer. This analysis is performed by means of a third parameter which can be different from the first and second parameters. It can also be envisaged that the third parameter be identical to the first and/or second parameters used beforehand.

For example, for a deposition of GaAs of a total thickness of 270 nm, the protocol described in the foregoing makes it possible to rapidly determine that it is preferable to deposit a first layer of GaAs at a pressure $P_0$ equal to 80 Torr, with a temperature $T_0$ equal to 525° C. and a thickness of the first layer 3 comprised between 20 nm and 40 nm.

As indicated in the foregoing, the GaAs layer is broken down into a first nucleation layer and a second thickening layer. These two layers are fabricated with different operating conditions. The second layer 2b is not advantageous to form the whole of layer 2 as it does not enable low defect densities to be obtained. It is therefore advantageous to dissociate the layer 2 into a layer 2a, followed by a layer 2b.

In the foregoing exemplary embodiments, the organometallic precursors are Tributhylarsenic and Tributhylgallium. It is however possible to use other organometallic precursors, for example triethylgallium or trimethygallium. It is further possible to use precursors of hydride type, for example arsine (AsH3) for arsenic.

Although the above examples present deposition of GaAs on a germanium layer, it is possible to use this fabrication method for deposition of a layer of InP on a germanium layer which may itself be formed on a silicon substrate.

In an advantageous embodiment, the thickness of the first layer 3 is fixed to a value comprised between 20 nm and 40 nm. In this exemplary case, the third series of samples is not made which enables time to be saved while achieving an interesting result. It is nevertheless advantageous to make the third series of samples to obtain an optimal result.

In an alternative embodiment, the second series of samples is made before the first series of samples in order to fix the deposition temperature before defining the deposition pressure. This embodiment also enables a satisfactory operating point to be found. However, this operating point is different from the previously described operating point and it is apparent that the deposition rates obtained are lower. This variant therefore seems to be less advantageous. For example, in this alternative embodiment, the optimal deposition temperature was chosen equal to 375° C. Then the deposition pressure was chosen equal to 450 Torr. The optimal thickness of the first layer 3 was chosen equal to 30 nm.

In this embodiment, a first set of samples is made (F7) in which the first layer of semiconductor material (3) of III-V type having a first thickness is covered by the second layer of semiconductor material (4) having a second thickness. The deposition conditions of the first layer of semiconductor material (3) of III-V type are chosen such that the deposition temperature differs between the samples. The deposition pressure is identical between the samples and equal to an initial deposition pressure.

A first deposition temperature ($T_0$) is then determined (F8) from the first series of samples and by means of at least one first parameter representative of the crystalline quality of the stack formed by the first and second layers of semiconductor material (3, 4) of III-V type.

A second series of samples is made (F9) in which the first layer of semiconductor material (3) of III-V type having the first thickness is covered by the second layer of semiconductor material (4) of III-V type having the second thickness. The deposition conditions of the first layer of semiconductor material (3) of III-V type are chosen such that the deposition pressure differs between the samples. The deposition temperature is identical between the samples and equal to the first deposition temperature ($T_0$).

A first deposition pressure ($P_0$) is then determined (F10) from the second series of samples and by means of the second parameter representative of the crystalline quality of the stack formed by the first and second layers of semiconductor material (3, 4) of III-V type.

The invention claimed is:

1. A method for determining deposition parameters of a first layer made from semiconductor material of III-V type in a sample successively comprising:
   a monocrystalline layer of relaxed germanium epitaxially grown from a first surface of crystalline orientation of (001) type of a monocrystalline silicon layer, the first surface presenting a misalignment of less than 1° with respect to a (001) plane,
   a first monocrystalline layer made from semiconductor material of III-V type formed by organometallic chemical vapor deposition,
   a second monocrystalline layer made from semiconductor material of III-V type formed by organometallic chemical vapor deposition, a stack formed by the first and second monocrystalline layers of semiconductor material of III-V type, the second monocrystalline layer being deposited with predetermined pressure and temperature conditions,
the method comprising:
   making a first series of samples in which for each sample the first layer of semiconductor material of III-V type having a first thickness is covered by the second layer of semiconductor material having a second thickness, the deposition conditions of the first layer of semiconductor material of III-V type being chosen such that the deposition pressure differs between the samples of the first series, the deposition temperature being identical between the samples of the first series and equal to an initial deposition temperature, comprised between 495° C. and 615° C., the deposition pressure varying between 20 Torr and 450 Torr,
   determining a first deposition pressure from the deposition pressures of the first series of samples and by means of at least a first parameter representative of a crystalline quality of the stack formed by the first and second monocrystalline layers of semiconductor material of III-V type,
   making a second series of samples in which for each sample the first layer of semiconductor material of III-V type having the first thickness is covered by the second layer of semiconductor material of III-V type having the second thickness, the deposition conditions of the first layer of semiconductor material of III-V type being chosen such that the deposition temperature differs between the samples of the second series, the deposition pressure being identical between the samples of the second series and equal to the first deposition pressure, the deposition temperature varying between 495° C. and 615° C.,
   determining a first deposition temperature from the deposition temperatures of the second series of samples and by means of a second parameter representative of the crystalline quality of the stack formed by the first and second monocrystalline layers of semiconductor material of III-V type,
   wherein the first deposition temperature and the first deposition pressure are different from the predetermined pressure and temperature conditions for depositing the second monocrystalline layer and wherein the first and second monocrystalline layers made from semiconductor material of III-V type covers a maximum of the monocrystalline layer of relaxed germanium.

2. The method for determining according to claim 1, comprising:
   making a third series of samples in which the first layer of semiconductor material of III-V type is covered by the second layer of semiconductor material of III-V type, the thickness of the stack formed by the first and second monocrystalline layers of semiconductor material of III-V type being constant, the deposition conditions of the first layer of semiconductor material of III-V type being chosen such that the deposited thickness differs between the samples of the third series, the deposition pressure being identical between the samples of the third series and equal to the first deposition pressure, the deposition temperature being equal between the samples of the third series and equal to the first deposition temperature,
   determining a third deposition thickness of the first layer of semiconductor material of III-V type from the third series of samples by means of a third parameter representative of the crystalline quality of the stack formed by the first and second monocrystalline layers of semiconductor material of III-V type.

3. The method for determining according to claim 1, wherein the second layer of semiconductor material of III-V type of each first and second series of samples is deposited at a pressure equal to 20 Torr and at a temperature equal to 615° C.

4. The method for determining according to claim 1, wherein the first thickness of the first layer of semiconductor material of III-V type is comprised between 10 nm and 80 nm.

5. The method for determining according to claim 4, wherein the first thickness of the first layer of semiconductor material of III-V type is comprised between 15 nm and 50 nm.

6. The method for determining according to claim 5, wherein the first thickness of the first layer of semiconductor material of III-V type is comprised between 20 and 40 nm.

7. The method for determining according to claim 1, wherein the initial deposition temperature is comprised between 500° C. and 550° C.

8. The method for determining according to claim 7, wherein the initial deposition temperature is comprised between 515° C. and 540° C.

9. The method for determining according to claim 1, wherein the monocrystalline germanium layer is produced by means of a first deposition of a first germanium layer at a temperature of less than 500° C. followed by a second deposition of a second germanium layer at a temperature of more than 500° C.

10. The method for determining according to claim 1, wherein the semiconductor material of III-V type of the first monocrystalline layer and of the second monocrystalline layer is chosen from GaAs, InP and the following ternary alloys: AlGaAs, InGaAs with an indium concentration less than or equal to 10%.

11. The method for determining according to claim 1, wherein the first parameter is a slope break in a curve representative of a defect density visible by optic microscopic according to the deposition pressure.

12. The method for determining according to claim 1, wherein the second parameter is an extremum in a curve representative of a defect density visible by optic microscopic according to the deposition temperature.

13. The method for determining according to claim 2, wherein the third parameter is an extremum in a curve representative of a defect density visible by optic microscopic according to the thickness of the first layer of semiconductor material of III-V type.

14. A method for determining deposition parameters of a first layer made from semiconductor material of III-V type in a sample successively comprising:
    a monocrystalline layer of relaxed germanium epitaxially grown from a first surface of crystalline orientation of (001) type of a monocrystalline silicon layer, the first surface presenting a misalignment of less than 1° with respect to a (001) plane,
    a first monocrystalline layer made from semiconductor material of III-V type formed by organometallic chemical vapor deposition,
    a second monocrystalline layer made from semiconductor material of III-V type formed by organometallic chemical vapor deposition, a stack formed by the first and second monocrystalline layers of semiconductor material of III-V type, the second monocrystalline layer being deposited with predetermined pressure and temperature conditions,
the method comprising:
    making a first series of samples in which for each sample the first layer of semiconductor material of III-V type having a first thickness is covered by the second layer of semiconductor material having a second thickness, the deposition conditions of the first layer of semiconductor material of III-V type being chosen such that the deposition temperature differs between the samples of the first series, the deposition pressure being identical between the samples of the first series and equal to an initial deposition pressure, the deposition temperature varying between 495° C. and 615° C.,
    determining a first deposition temperature from the deposition temperatures of the first series of samples and by means of at least a first parameter representative of the crystalline quality of the stack formed by the first and second monocrystalline layers of semiconductor material of III-V type,
    making a second series of samples in which for each sample the first layer of semiconductor material of III-V type having the first thickness is covered by the second layer of semiconductor material of III-V type having the second thickness, the deposition conditions of the first layer of semiconductor material of III-V type being chosen such that the deposition pressure differs between the samples of the second series, the deposition temperature being identical between the samples of the second series and equal to the first deposition temperature, the deposition pressure varying between 20 Torr and 450 Torr,
    determining a first deposition pressure from the deposition pressures of the second series of samples and by means of a second parameter representative of the crystalline quality of the stack formed by the first and second monocrystalline layers of semiconductor material of III-V type,
    wherein the first deposition temperature and the first deposition pressure are different from the predetermined pressure and temperature conditions for depositing the second monocrystalline layer and wherein the first and second monocrystalline layers made from semiconductor material of III-V type covers a maximum of the monocrystalline layer of relaxed germanium.

15. The method for determining according to claim 14, comprising:
    making a third series of samples in which the first layer of semiconductor material of III-V type is covered by the second layer of semiconductor material of III-V type, the thickness of the stack formed by the first and second layers of semiconductor material of III-V type being equal to the thickness E, the deposition conditions of the first layer of semiconductor material of III-V type being chosen such that the deposited thickness differs between the samples of the third series, the deposition pressure being identical between the samples of the third series and equal to the first deposition pressure, the deposition temperature being equal between the samples of the third series and equal to the first deposition temperature,
    determining a third deposition thickness of the first layer of semiconductor material of III-V type from the first series of samples by means of a third parameter representative of the crystalline quality of the stack formed by the first and second monocrystalline layers of semiconductor material of III-V type.

16. The method for determining according to claim 14, wherein the second layer of semiconductor material of III-V type of each first and second sample is deposited at a pressure equal to 20 Torr and at a temperature equal to 615° C.

17. The method for determining according to claim 14, wherein the first thickness of the first layer of semiconductor material of III-V type is comprised between 10 nm and 80 nm.

* * * * *